(12) United States Patent
Vaartstra

(10) Patent No.: US 6,770,426 B1
(45) Date of Patent: Aug. 3, 2004

(54) SUPERCRITICAL COMPOSITIONS FOR REMOVAL OF ORGANIC MATERIAL AND METHODS OF USING SAME

(75) Inventor: Brian A. Vaartstra, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/651,702

(22) Filed: Aug. 30, 2000

Related U.S. Application Data (62) Division of application No. 09/141,866, filed on Aug. 28, 1998, now Pat. No. 6,242,165.

(51) Int. Cl.[7] .............................. G03F 7/42; B08B 5/00
(52) U.S. Cl. ..................... 430/331; 430/97; 430/329; 430/464; 134/1; 134/1.3; 216/49; 216/58; 252/570; 252/574; 252/578; 252/79.1; 252/372; 252/183.14; 205/763; 510/108; 510/109; 510/175; 510/176
(58) Field of Search .................. 430/97, 329, 331, 430/464; 134/1, 1.3; 216/49, 58; 252/570, 574, 578, 79.1, 372, 183.1, 183.14; 205/763; 510/108, 109, 175, 176

(56) References Cited

U.S. PATENT DOCUMENTS

| | | | |
|---|---|---|---|
| 4,296,146 A | 10/1981 | Penn ........................... | 427/58 |
| 4,725,375 A | 2/1988 | Fujii et al. ................. | 252/79.4 |
| 4,778,536 A | 10/1988 | Grebinski ..................... | 134/36 |
| 4,861,424 A | 8/1989 | Fujimura et al. ........... | 156/643 |
| 4,944,837 A | 7/1990 | Nishikawa et al. .......... | 156/646 |
| 5,013,366 A | 5/1991 | Jackson et al. ................ | 134/1 |
| 5,037,506 A | 8/1991 | Gupta et al. ................. | 156/646 |
| 5,256,247 A | 10/1993 | Watanabe et al. ........... | 156/653 |
| 5,298,112 A | 3/1994 | Hayasaka et al. ........... | 156/646 |
| 5,382,316 A | 1/1995 | Hills et al. .................... | 156/643 |
| 5,389,263 A * | 2/1995 | Gallagher et al. .......... | 210/729 |
| 5,401,322 A | 3/1995 | Marshall ....................... | 134/13 |
| 5,403,436 A | 4/1995 | Fujimura et al. ........... | 156/643 |
| 5,482,211 A * | 1/1996 | Chao et al. .................. | 239/135 |
| 5,496,485 A | 3/1996 | Maternaghan ............. | 252/79.3 |

(List continued on next page.)

FOREIGN PATENT DOCUMENTS

WO    WO 95/20476    8/1995

OTHER PUBLICATIONS

G. Bakker et al., "Removal of Thermally Grown Silicon Dioxide Films Using Water at Elevated Temperature and Pressure", *J. Electrochem. Soc.*, 142(11), 3940–3944 (1995).
M. Dax, "Removing Photoresist Without Plasmas or Liquid Strippers," *Semiconductor International: Contamination Control News*, 52 (Sep. 1996).
Deal et al., "Vapor Phase Wafer Cleaning: Processing for the 1990s," *Solid State Technology*, 73–77 (Jul. 1990).

(List continued on next page.)

*Primary Examiner*—Nicole Barreca
(74) *Attorney, Agent, or Firm*—Mueting, Raasch & Gebhardt, P.A.

(57) ABSTRACT

A method for removing organic material in the fabrication of structures includes providing a substrate assembly having an exposed organic material and removing at least a portion of the exposed organic material using a composition including sulfur trioxide ($SO_3$) in a supercritical state. For example, the exposed organic material may be selected from the group of resist material, photoresist residue, UV-hardened resist, X-ray hardened resist, carbon-fluorine containing polymers, plasma etch residues, and organic impurities from other processes. Further, organic material removal compositions for performing such methods are provided.

22 Claims, 3 Drawing Sheets

U.S. PATENT DOCUMENTS

| | | |
|---|---|---|
| 5,635,463 A | 6/1997 | Muraoka .................... 510/175 |
| 5,643,474 A | 7/1997 | Sangeeta .................... 216/96 |
| 5,651,860 A | 7/1997 | Li .......................... 156/659.11 |
| 5,803,956 A | 9/1998 | Ohmi et al. ............... 106/1.05 |
| 5,885,362 A | 3/1999 | Morinaga et al. ............. 134/2 |
| 6,024,801 A | 2/2000 | Wallace et al. ............... 134/1 |
| 6,149,828 A | 11/2000 | Vaartstra ..................... 216/57 |
| 6,242,165 B1 | 6/2001 | Vaartstra .................... 437/329 |

OTHER PUBLICATIONS

T. Nolan, "Economic Geology and the Bulletin of the Society of Economic Geologists", 45(7), Title Page, Table of Contents, pp. 601, 629–653 (1950).

Webster's New Collegiate Dictionary, G & C Merriam Co., Copyright 1979, pp. 971, 1048, and 1049.

* cited by examiner

SUPERCRITICAL COMPOSITIONS FOR REMOVAL OF ORGANIC MATERIAL AND METHODS OF USING SAME

This is a division of application Ser. No. 09/141,866, filed on Aug. 28, 1998, now U.S. Pat. No. 6,242,165, which is incorporated herein by reference.

FIELD OF THE INVENTION

The present invention relates to the treating of surfaces of an object, e.g., treating of wafer surfaces in the fabrication of semiconductor devices. More particularly, the present invention relates to removal of organic material, e.g., etching or cleaning of resists, organic residues, etc., from surfaces using supercritical compositions including an oxidizer.

BACKGROUND OF THE INVENTION

Removal of organic materials (e.g., stripping of photoresist used for fabrication of semiconductor devices, cleaning of organic residues from surfaces of objects or structures, removal of polymers from crevices or grooves of structures or from other difficult regions of a structure, etc.) is one of various steps required in the production of semiconductor devices or other objects such as flat panel displays. For example, whenever photoresist or other organic masks are used, removal of organic material is typically necessary.

The removal of photoresist or other organic material is usually performed by either a dry or wet removal method. Wet removal techniques generally involve the use of specialized oxidizing solutions such as sulfuric acid and hydrogen peroxide solutions. Wet removal generally refers to the contact of a surface with a liquid chemical solution. For example, material is removed as an agitated liquid or spray passes over the surface. Dry etching refers to the contact of a surface with a gaseous plasma composition. Dry removal techniques generally remove organic material using oxygen plasmas, e.g., oxygen ash techniques, and possibly with hydrogen plasma assistance.

Removal of photoresist or other organic material from complex structures is typically done in an oxygen plasma ash tool or with a multiple step wet strip process, or combinations thereof. However, for example, as semiconductor device structure geometries and other structure geometries continue to get smaller, e.g., into the submicron range such as below 0.25 micron, neither conventional dry removal nor wet removal techniques provide adequate removal of organic material during the processing of such complex structures without damaging the structure being produced. For example, with device structures having critical dimensions below 0.25 micron geometries, conventional techniques may not be adequate for removal of organic material such as ultraviolet (UV) radiation hardened photoresist and/or sidewall deposited resist or residue, nor adequate for removal of organic material such as organic residue in difficult crevices or grooves of such device structures.

Various processing steps produce problems for the removal of organic material, e.g. photoresist. For example, surface hardening of photoresist due to reactive ion etching (REI) or ion implantation processes increases the difficulty in such removal. Further, for example, post formation bakes and UV curing steps may cause chemical changes in the photoresist that may cause difficulty in removal of the resists.

Both wet and dry organic removal techniques may not provide adequate removal when organic materials are present in complex structures, such as high aspect ratio openings, including submicron grooves, narrow crevices, etc. Wet stripping techniques do not appear to overcome such problems and generally result in incomplete photoresist removal. For example, both grooves and crevices render wet stripping solutions ineffective by limiting the solvent access to the organic material to be removed by reason of surface tension and capillary actions.

Dry techniques may also fail to completely remove such organic material in grooves and crevices, particularly due to the polymer formed on sidewalls of the resist. Dry plasma etching also appears to result in incomplete removal. For example, sidewall polymer formations may occur as a result of the interaction of released by-products of plasma etching with the sidewalls of the structure. Such polymers are not easily removed using ashing processes.

While wet etchants have many preferable characteristics as compared to dry etchants, dry etchants can be used in fabrication processes without the need to dry the structure being processed after a dry organic material removal step has been performed. The added step of drying the structure that is required when using a conventional wet etchant adds to the cost of fabrication. A lack of full process automation may also result from the added step of drying the structure. Another advantage of etching with a dry etchant is that it often decreases the safety hazards associated with wet removal solutions due to the relatively small amount of chemicals utilized in the dry etchant, e.g., environmentally advantageous.

Supercritical fluids have been used to remove organic residue from a variety of surfaces or extract substances from various materials. A gas is determined to be in a supercritical state (and is referred to as a supercritical fluid) when it is subjected to a combination of pressure and temperature so that its density approaches that of a liquid (i.e., the liquid and gas state coexist). For example, supercritical fluids have been used to clean contact lenses by etching residue from lense surfaces, as disclosed by Bawa et al. in PCT Application Publication Number WO 95/20476. Further, supercritical carbon dioxide ($CO_2$), has also been used to remove exposed organic photoresist films, as disclosed by Nishikawa et al. in U.S. Pat. No. 4,944,837.

It is also known that organic material is removed rather well by certain oxidizing gases, in particular, sulfur trioxide. For example, as described in U.S. Pat. No. 5,037,506 to Gupta et al., entitled "Method of Stripping Layers of Organic Materials," issued 6 Aug. 1991, gaseous sulfur trioxide is used to remove various organic coatings, polymerized photoresist, and implant and deep-UV hardened photoresist layers during the manufacture of semiconductor or ceramic devices. Further, for example, as described in U.S. Pat. No. 4,778,536 to Grebinski, entitled "Sulfur Trioxide Vapor Phase Stripping" issued 18 Oct. 1988, water vapor is contacted with sulfur trioxide vapor adjacent the surface of an object to provide a hot mixture comprising sulfur trioxide, water, and sulfuric acid to remove photoresist.

SUMMARY OF THE INVENTION

Compositions and methods are needed which achieve effective removal of organic materials. For example, effective removal is required in many circumstances, such as, in high aspect ratio geometries, complex structures, when side wall polymerization occurs as a result of an etching process, when resist is UV hardened, etc. The present invention provides compositions and methods for achieving such removal.

A method for removing organic material in the fabrication of structures according to the present invention includes providing a substrate assembly having an exposed organic material and removing at least a portion of the exposed organic material using a composition having at least one component in a supercritical state. The composition includes an oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$). For example, the exposed organic material may be selected from the group of resist material, photoresist residue, UV-hardened resist, X-ray hardened resist, carbon-fluorine containing polymers, plasma etch residues, and organic impurities from other processes.

In one embodiment of the method, the at least one component in a supercritical state is an oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); preferably sulfur trioxide.

In another embodiment of the method, the composition includes a supercritical component in a supercritical state selected from the group of carbon dioxide ($CO_2$), ammonia ($NH_3$), $H_2O$, nitrous oxide ($N_2O$), carbon monoxide (CO), inert gases (e.g., nitrogen ($N_2$), helium (He), neon (Ne), argon (Ar), krypton (Kr), and xenon (Xe); preferably carbon dioxide.

In yet another embodiment of the method, the supercritical component is carbon dioxide and the oxidizer is sulfur trioxide.

An organic material removal composition according to the present invention includes a composition having at least one component in a supercritical state. The composition includes an oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$).

In one embodiment of the composition, the at least one component in a supercritical state is the oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); preferably sulfur trioxide.

In another embodiment of the composition, the composition includes a supercritical component in the supercritical state selected from the group of carbon dioxide ($CO_2$), ammonia ($NH_3$), $H_2O$, nitrous oxide $N_2O$), carbon monoxide (CO), inert gases (e.g., nitrogen ($N_2$), helium (He), neon (Ne), argon (Ar), krypton (Kr), and xenon (Xe); preferably carbon dioxide.

In another method according to the present invention for use in fabricating a semiconductor structure, the method includes providing a pressurizable chamber and introducing at least one component of a composition into the chamber. A substrate assembly having exposed organic material is positioned within the chamber. The pressure and temperature of the chamber is controlled for maintaining the at least one component of the composition in a supercritical state. The composition includes an oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$). At least a portion of the organic material is removed from the substrate assembly using the composition having the at least one component in the supercritical state.

In one embodiment of the method, the at least one component in a supercritical state is an oxidizer selected from the group of sulfur trioxide ($SO_3$), sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); preferably sulfur trioxide.

In another embodiment of the method, the composition includes a supercritical component in a supercritical state selected from the group of carbon dioxide ($CO_2$), ammonia ($NH_3$), $H_2O$, nitrous oxide ($N_2O$), carbon monoxide (CO), inert gases (e.g., nitrogen ($N_2$), helium (He), neon (Ne), argon (Ar), krypton (Kr), and xenon (Xe); preferably carbon dioxide.

DETAILED DESCRIPTION OF THE INVENTION

Supercritical compositions for removal of organic material and methods for using such compositions are described herein. The following description is illustrative of various embodiments of the invention.

As used herein, the term substrate assembly includes a wide variety of structures, e.g., semiconductor-based structures, that can be etched or have organic material or layers that can be removed. A substrate assembly can be a single layer of material, such as, for example, a silicon (Si) wafer, or can include any other number of layers. Substrate assembly is also to be understood as including silicon-on-sapphire (SOS) technology, silicon-on-insulator (SOI) technology, doped and undoped semiconductors, epitaxial layers of silicon (Si) supported by a base semiconductor, as well as other semiconductor-based structures, including any number of layers as is well known to one skilled in the art. Furthermore, when reference is made to a substrate assembly in the following description, previous process steps may have been utilized to form regions/junctions in a base semiconductor structure. The substrate assembly from which organic material is to be removed can have a patterned mask layer thereon, such as, for example, a patterned resist layer. Yet further, when reference is made to a substrate assembly in the following description, the substrate assembly can be other than a semiconductor-based structure. For example, the substrate assembly may be a structure including one or more layers of other materials, for example, such as glass, tin indium oxide, or other materials used in producing base plates or face plates of flat panel displays. The following detailed description is, therefore, not to be taken in a limiting sense, and the scope of the present invention is defined by the accompanying claims.

A gas enters the supercritical state when the combination of pressure and temperature of the environment in which the gas is contained is above a critical state. For example, the critical temperature of carbon dioxide ($CO_2$) is 31° C. The critical pressure of $CO_2$ is 7.38 MPa (72.8 atmospheres (atm)). When $CO_2$ is subjected to temperatures and pressures above 31° C. and 7.38 MPa (72.8 atm), respectively, it is in the supercritical state. Further, for example, the critical temperature of sulfur trioxide ($SO_3$) is 218.3° C. The critical pressure of sulfur trioxide is 83.8 atm. When sulfur trioxide is subjected to temperatures and pressures above the critical temperature and pressure, it is in the supercritical state. The critical temperature and pressure of other components is readily calculated or experimentally determined by one skilled in the art.

A gas in the supercritical state is referred to as a supercritical fluid. Supercritical fluids have high solvating capabilities that are typically associated with compositions in the liquid state. Supercritical fluids also have a low viscosity that is characteristic of compositions in the gaseous state. Furthermore, supercritical fluids are able to penetrate (i.e., effectively contact) surfaces better than compositions in the liquid state.

At least one supercritical component is used in the compositions of the present invention to effectuate the removal of organic material. Supercritical component, as used herein, encompasses all compounds or elements that are present as supercritical fluids.

In one embodiment of a composition for removal of organic material according to the present invention, the supercritical component of the composition includes one or more oxidizer components to effectively remove the organic material. At least one of the oxidizer components must be in a supercritical state. Generally, the at least one oxidizer component is a strong oxidizing agent (i.e., the oxidizer component is known to oxidize organic material). Preferably, the at least one oxidizer in the supercritical state is an oxidizer component selected from the oxidizers including sulfur trioxide ($SO_3$), sulfur dioxide ($SO_2$), nitrous oxide ($N_2$), NO, $NO_2$, ozone ($O_3$), hydrogen peroxide ($H_2O_2$), $F_2$, $Cl_2$, $Br_2$, and oxygen ($O_2$). More preferably, the oxidizer component used in the composition for removal of organic material is sulfur trioxide. For example, in a preferred embodiment, the composition used to remove the organic material may be a single supercritical oxidizer component, e.g., sulfur trioxide in a supercritical state.

In an alternate embodiment of a composition for removal of organic material according to the present invention, the composition includes a supercritical fluid mixture of at least one oxidizer component and one or more additional components (i.e., components other than oxidizer components). At least one of the one or more additional components must be in the supercritical state if an oxidizer component is not in the supercritical state. However, both one or more of the oxidizer components and one or more of the other additional components of the supercritical fluid mixture may be in the supercritical state.

Preferably, when the supercritical fluid mixture does not include at least one oxidizer in a supercritical state, at least one of the additional components must be in a supercritical state. In such a supercritical fluid mixture, preferably, the additional component in a supercritical state is selected from the group of carbon dioxide ($CO_2$), ammonia ($NH_3$), $H_2O$, nitrous oxide ($N_2O$), carbon monoxide (CO), inert gases (e.g., nitrogen ($N_2$), helium (He), neon (Ne), argon (Ar), krypton (Kr), xenon (Xe), etc.), and similar components, or combinations of the above. Some of the above possible combinations may react to form other active agents (e.g., $SO_3$ reacts with $H_2O$ to form $H_2SO_4$).

The use of such additional components in supercritical states to form supercritical fluid mixtures for removal of organic material allow for tailoring the parameters of the removal process, e.g., the temperature and pressure of the supercritical fluid mixture. For example, in one preferred composition, a sulfur trioxide oxidizer component is used in a supercritical fluid of carbon dioxide. The pressure of the system using such a composition can be maintained at a lower state since the critical pressure of carbon dioxide is significantly lower than the supercritical pressure of sulfur trioxide. In this illustrative example of a supercritical fluid mixture including carbon dioxide and sulfur trioxide, the ratio of carbon dioxide:sulfur trioxide is preferably in the range of about 10:1 by volume to about 1:1 by volume. Generally, the ratio of the oxidizer component to the additional component in the supercritical state is in the range of about 1:100 by volume to about 100:1 by volume.

Other additional components may be used to enhance the organic material removal process. Such components may or may not be in a supercritical state. For example, such components may include components, such as inorganic acids (e.g., HCl, HBr, HF), buffering agents (e.g., ammonium fluoride ($NH_4F$), tetramethyl ammonium fluoride ($Me_4NF$)), surfactants, selectivity enhancers (e.g., tetramethyl ammonium hydroxide ($Me_4NOH$), tetramethyl nitrogen fluoride ($Me_4NF$), and ammonium fluoride ($NH_4F$)), or ligands (e.g., beta-diketones, fluorinated-diketones, organic acids, and the like) to enhance the etching effectiveness or protect other layers of the structure that are present.

One skilled in the art will recognize that the composition may be formed in a variety of manners and any particular sequence used to attain a composition as described herein is only for illustrative purposes. For example, a supercritical fluid component, e.g., carbon dioxide in the supercritical state, may be added to a supercritical oxidizer component to form a supercritical etching composition; a component not in a supercritical state may be added to a supercritical component either before it is brought to the supercritical state or after it is brought to the supercritical state; a component not in a supercritical state may be provided into an etching chamber while the substrate is being exposed to the supercritical oxidizer component; a supercritical oxidizer component (e.g., $SO_3$) may be introduced to the substrate alone, etc.

Further, by varying combinations of pressure and temperature, variable removal characteristics can be obtained. For example, increasing pressure on the supercritical composition causes its density to increase, thus increasing its solvent strength. Increasing the temperature of the supercritical composition normally increases the removal rate of the organic material.

A wide variety of organic materials can be effectively removed using the compositions and methods of the present invention. For example, resist material, photoresist residue, organic residues, carbon-fluorine containing polymers such as those resulting from oxide etching processes or plasma etch processes, and organic impurities from other processes, may be removed according to the present invention. Such compositions and methods are particularly beneficial for removing ion implanted resist, UV hardened resist, X-ray hardened resist and resist in submicrometer grooves or crevices.

Figure 1:
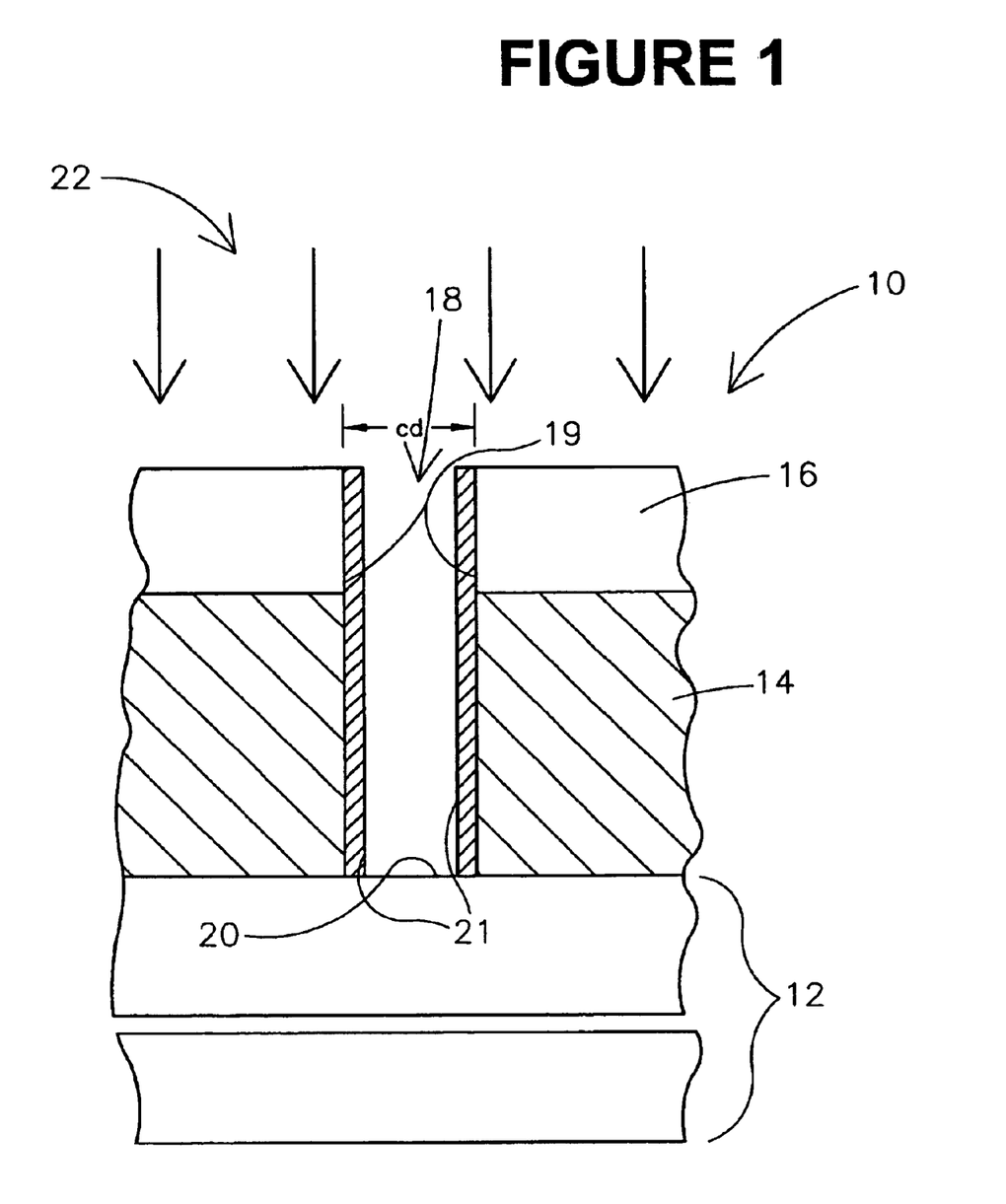
FIG. 1 is an illustrative representation of a substrate assembly including organic material to be removed in accordance with the present invention.

FIG. 1 is an illustrative representation of a structure 10 including organic material to be removed in accordance with the present invention. As shown in FIG. 1, the structure includes a substrate assembly 12 having an additional layer 14, such as an oxide layer, formed thereon. The layer 14 is patterned using a photoresist layer 16 which defines the opening 18 through the layer 14. With the photoresist layer 16 patterned, the opening 18 is etched to surface 20 using a plasma such as a fluorocarbon or hydrofluorocarbon plasma.

As shown in FIG. 1, during the etching of the opening 18, organic material, e.g., a nonvolatile polymeric residual layer 21, may be formed on the side walls 19 of the opening 18 being defined. Such organic material 21, in addition to the photoresist layer 16, is removed using a composition 22 according to the present invention prior to other process steps being performed. It will be apparent to one skilled in the art that the structure being formed may be one of any number of different structures. The present invention is not limited to any particular structure described herein. For example, the structure being formed may be part of various devices or circuits, such as SRAMs, DRAMs, flat panel displays, any structure formed with the use of resist material, etc.

The present invention is particularly beneficial for defining structures having critical dimensions of less than 1 micron and preferably any features having a it, critical dimension of less than or equal to about 0.6 microns, more preferably those features having a critical dimension of less than about 0.25 microns. For example, the present invention is beneficial for removal of organic material in small high aspect ratio features. Small high aspect ratio features are defined herein as features having aspect ratios (i.e., the height to spacing ratio of two adjacent steps of a substrate assembly such as steps which define an opening, a trench, etc.) greater than about 1 and features sizes or critical dimensions of below about 1 micron (e.g., such as opening width (cd) of FIG. 1 being less than about 1 micron). Although the present invention is particularly beneficial for definition of such small high aspect ratio features, the removal of organic material from other sized structures is clearly contemplated in accordance with the present invention.

It is desirable to decrease the use of relatively high temperature processing steps for relatively long periods of time. A process sequence in the fabrication of semiconductor integrated circuits (ICs) ideally maintains a relatively low thermal budget. The thermal budget for an IC process sequence is that combination of time and temperature for heat treatments utilized in the fabrication of the IC, above which electrical performance of the IC is possibly degraded. An IC can only be subjected to a limited number of thermal steps for a limited amount of time before its electrical performance is potentially detrimentally affected. For example, thermal steps often cause dopant gradients at junctions between two regions in an IC to diffuse, such that the potential barrier between the two regions is altered. Furthermore, thermal steps often cause dopants to migrate into undesired regions, altering device characteristics. For example, because transistors are formed prior to the capacitor in many dynamic random access memory (DRAM) devices, it is desirable to use relatively low temperatures to form the capacitor because higher temperatures cause dopants to diffuse, forming dopant gradients, across the many junctions therein.

Preferably, the temperature range used to remove organic material according to the present invention is in the range of about 30° C. to about 250° C. Of course, because at least one component of the composition used to remove the organic material must be in a supercritical state, the temperatures used will need to satisfy the critical temperature requirements for the component which exists in the supercritical state in the composition. For example, relatively low temperatures may be achieved by using carbon dioxide as the supercritical component in the composition. Carbon dioxide has a critical temperature of 31° C. Therefore, use of a $CO_2$ supercritical component with an oxidizer component (not in a supercritical state) may be used such that thermal budget is conserved. When temperature constraints are not present, for example, such as in early fabrication steps, sulfur trioxide may be used in its supercritical state alone.

Further, preferably, the pressure range used to remove organic material according to the present invention is in the range of about 1 atmosphere to about 250 atmospheres. Of course, because at least one component of the composition used to remove the organic material must be in a supercritical state, the pressure used will need to satisfy the critical pressure requirements for the component which exists in the supercritical state in the composition. By using a supercritical component with a lower pressure, lower pressure processing parameters can be achieved.

Supercritical etching compositions can be environmentally advantageous over current chemistries, particularly where $CO_2$ is the primary supercritical component. $CO_2$ is much less toxic than many standard wafer cleaning compositions. Supercritical fluids also offer high purity when compared to liquid chemical etchants since they are typically purified as gases. Further, supercritical fluids are also capable of being relatively easy to recycle.

Due to the high rate of penetration that is characteristic of supercritical fluids as compared to wet etchants, removal of organic material in accordance with the present invention is more uniform. Uniformity is promoted due to the superior wetting abilities of supercritical compositions, along with their ability to break away material from within etched or partially etched openings of a structure. Another desirable advantage of using supercritical compositions and methods of the present invention is that drying steps are not needed in the IC processing sequence subsequent to an organic material removal step in accordance with the present invention. Elimination of such drying steps contributes to optimizing efficiency in the fabrication of ICs.

The organic material removal process according to the present invention may be employed in batch or continuous processing operational modes. In either case, components of the organic material removal composition are provided to a chamber that includes structures such as that described with reference to FIG. 1. The chamber is typically purged prior to providing such components to the chamber, such as with nitrogen or some other inert gas. The flow rate of the components into the chamber will depend on the nature of the organic material removal composition and also on the type and characteristics of the organic material to be removed, e.g., thickness, hardened resist versus ion-implanted resist, etc. The exposure time of the removal composition to structures in the chamber will also vary. A typical time of exposure may be from about 5 seconds to about 10 minutes. Likewise, the removal rate of the organic material will also depend on the nature of the organic material removal composition and also on the type and characteristics of the organic material to be removed. A typical removal rate may be in the range of about 10 Å/minute to about 1 micron/minute.

Figure 2:
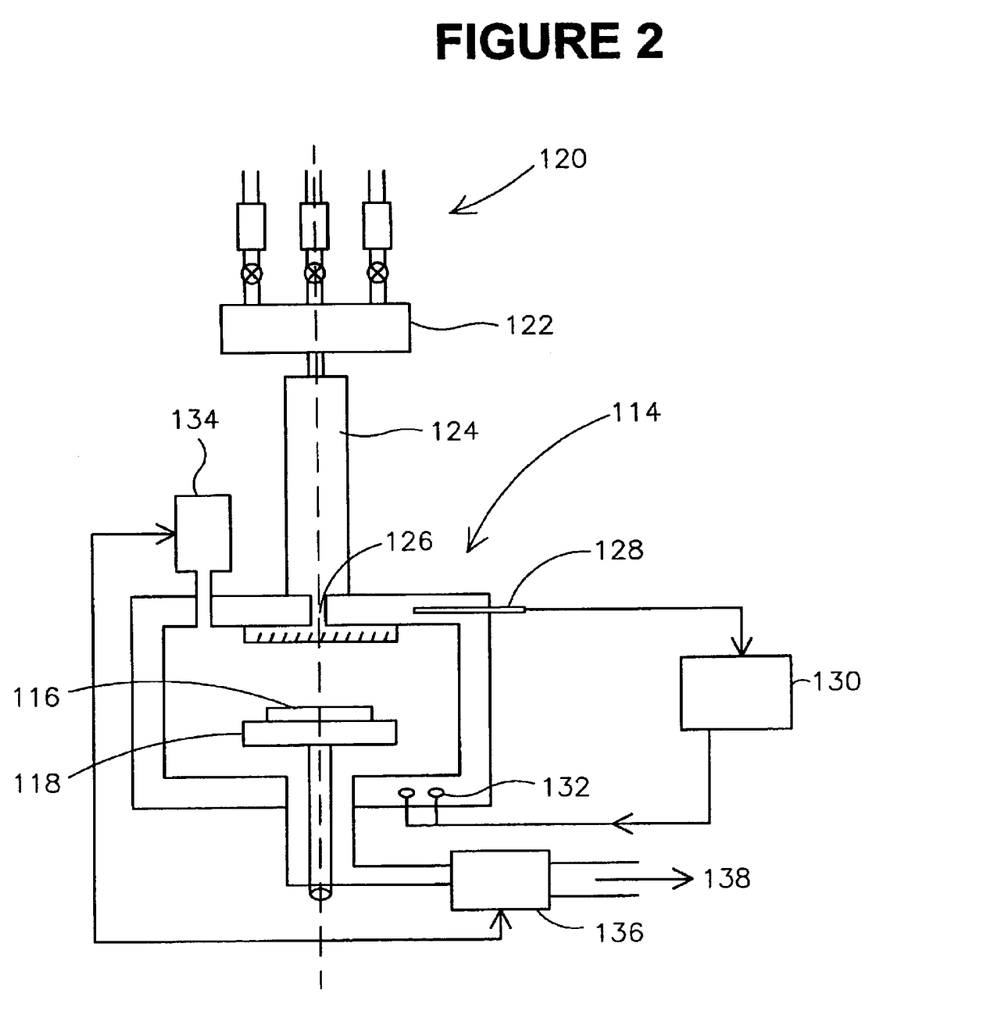
FIG. 2 is a schematic representation of a pressure vessel for use in removal of organic material in accordance with the present invention.

According to the present invention, a substrate assembly having organic material that is to be removed (e.g., a semiconductor-based substrate assembly patterned with a photoresist, a base plate of a flat panel display patterned with a photoresist) is exposed to an organic material removal composition according to the present invention and as previously described herein. A preferred process sequence utilizes an apparatus preferably customized for the particular composition. For example, a pressure vessel 114 shown in FIG. 2 is a useful tool in which to expose a substrate assembly 116 to the organic material removal composition according to the present invention. The pressure vessel 114 includes a chuck or holder 118 for supporting and/or rotating the substrate assembly 116. Mass or liquid flow controllers 120 operatively attached to the pressure vessel 114 control the input of each component of the composition. For example, an oxidizer component, e.g., sulfur trioxide, and an additional component, e.g., carbon dioxide, each enter the pressure vessel 114 directly through a separate control 120. It should be understood, however, that an optional mixing manifold 122 can be used that allows for the mixing of the components prior to their entering the pressure vessel 114 as well as allowing for any number of different components to be mixed.

As illustrated in FIG. 2, the components can be pre-mixed in mixing manifold 122. The components can also be heated in the mixing manifold 122 by including heating coils or vanes in walls of manifold 122 to increase heat transfer to the components before passing through an optional circulation heater 124, such as a circulation heater supplied by Watlow Co. of Saint Louis, Mo. The organic residue removal composition then enters the pressure vessel 114 through a dispensing device 126, such as a shower-head, with at least one of the components in the supercritical state. The circulation heater 124 is preferably used to increase the heating efficiency of the system when creating the supercritical composition in the mixing manifold 122 prior to entering the pressure vessel 114. The organic material removal composition passes over the substrate 116 from the dispensing device 126.

It is also to be understood that the supercritical etching composition can optionally pass directly over the substrate 116 from a heated transfer line without using a dispensing device 126. Alternatively, each component of the supercritical etching composition can enter the pressure vessel through plumbed supply lines, where the components can then be brought to the supercritical state. The supercritical etching composition is passed over the substrate 116 until the desired to organic material is removed.

The pressure vessel 114 also includes a heating mechanism and a pressurization mechanism for controlling the temperature and pressure of the pressure vessel 114. Temperature and pressure within the pressure vessel 114 is at or above the critical temperature and pressure for the components desired to be in a supercritical state. A thermocouple 128 monitors temperature within the pressure vessel 114 and relays an appropriate signal to a temperature control unit 130. The temperature control unit 130 sends appropriate signals to heater inputs 132, which provide heat to the pressure vessel 114. A pressure gauge 134 monitors pressure within the pressure vessel 114 and sends appropriate signals to a pressure control in 320 unit 136, which pressurizes/depressurizes the pressure vessel 114. Excess composition is vented or pumped through a vent or pumping system in the direction indicated by arrow 138. For example, the organic material removal composition passes from the pressure vessel 114 to the vent or pumping pressure control system 136 by operation of a pressure differential.

Figure 3:
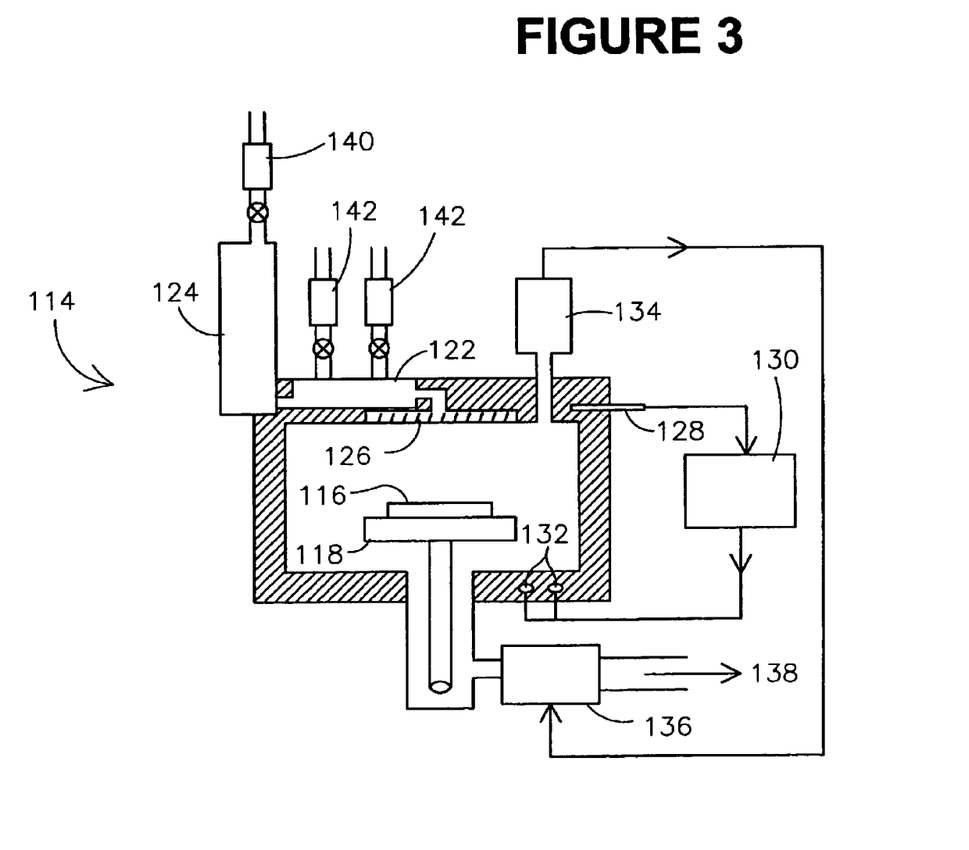
FIG. 3 is a schematic representation of an alternate pressure vessel for use in removal of organic material in accordance with the present invention.

It will be recognized by one skilled in the art that other alternative configurations of tools such as illustrated in FIG. 3 can be useful for removing organic material from a substrate assembly 116 using an organic material removal composition according of the present invention. The tool illustrated in FIG. 3 is similar to the tool illustrated in FIG. 2, but the oxidizing component (prior to being brought to the supercritical state) first flows from mass or liquid flow controller 140 through circulation heater 124 prior to entering the mixing manifold 122, where any additional components enter through mass or liquid flow controllers 142. When the oxidizer component is capable of etching a particular inorganic material in and of itself, and when using the tool illustrated in FIG. 3, other additional components need not be added to the mixing manifold 122 from mass or liquid flow controllers 142.

In one preferred embodiment of the present invention, the organic material removal composition includes only sulfur trioxide in its supercritical state. A pressurizable chamber is heated above the critical temperature (218.3° C.) of sulfur trioxide, preferably below about 250° C. The chamber is then provided with sulfur trioxide at a pressure above the critical pressure (83.8 atmospheres), preferably below about 100 atmospheres. A preferred desired flow of the sulfur trioxide into the pressure chamber is in the range of about 100 sccm to about 1000 sccm. The organic material is removed during a preferred time range of about 10 seconds to about 60 seconds with a removal rate of about 100 Å/minute to about 1 micron/minute.

In another preferred embodiment of the present invention, the organic material removal composition includes sulfur trioxide in a nonsupercritical state and carbon dioxide in a supercritical state. A pressurizable chamber is heated above the critical temperature (31° C.) of carbon dioxide, preferably below about 50° C. The chamber is then provided with sulfur trioxide and carbon dioxide at a pressure above the critical pressure (72.8 atmospheres) of carbon dioxide, preferably below about 100 atmospheres. A desired flow of the sulfur trioxide into the pressure chamber is in the range of about 10 sccm to about 200 sccm. A desired flow of the carbon dioxide into the pressure chamber is in the range of about 200 sccm to about 1000 sccm. In other words, the ratio of sulfur trioxide:carbon dioxide is in the range of about 1:1 to about 1:100. The organic material is removed during a time period in the range of about 10 seconds to about 60 seconds with a removal rate of about 10 Å/minute to about 1 micron/minute.

All patents, patent applications, and publications disclosed herein are incorporated by reference in their entirety, as if individually incorporated. The foregoing detailed description and illustrations have been given for clarity of understanding only. No unnecessary limitations are to be understood therefrom. The invention is not limited to the exact details shown and described, for variations obvious to one skilled in the art will be included within the invention defined by the claims.

What is claimed is:

1. A composition comprising sulfur trioxide ($SO_3$) in a supercritical state, wherein the composition further comprises at least one oxidizer selected from the group consisting of sulfur dioxide ($SO_2$), nitrous oxide ($N_2O$), NO, $NO_2$, ozone ($O_3$), hydrogen peroxide, ($H_2O_2$), $F_2$, $Cl_2$, $Br_2$, and oxygen ($O_2$), and wherein the composition is an organic material removal composition.

2. The composition of claim 1, wherein the at least one oxidizer is in a supercritical state.

3. The composition of claim 1, further comprising a component selected from the group consisting of hydrogen chloride, hydrogen bromide, hydrogen fluoride, ammonium fluoride, tetramethylammonium fluoride, tetramethylammonium hydroxide, beta-diketones, fluorinated-diketones, organic acids, and combinations thereof.

4. The composition of claim 1, further comprising a substrate assembly in contact with the organic material removal composition.

5. A composition comprising sulfur trioxide ($SO_3$) in a supercritical state and an oxidizer, wherein the composition is an organic material removal composition.

6. The composition of claim 5, further comprising a component selected from the group consisting of hydrogen chloride, hydrogen bromide, hydrogen fluoride, ammonium fluoride, tetramethylammonium fluoride, tetramethylammonium hydroxide, beta-diketones, fluorinated-diketones, organic acids, and combinations thereof.

7. The composition of claim 5, further comprising a substrate assembly in contact with the organic material removal composition.

8. A composition comprising:
   a first component selected from the group consisting of carbon dioxide ($CO_2$), ammonia ($NH_3$), $H_2O$, nitrous oxide ($N_2O$), carbon monoxide (CO), nitrogen ($N_2$), helium (He), neon (Ne), argon (Ar), krypton (Kr), and xenon (Xe);
   a second component selected from the group consisting of sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); and
   sulfur trioxide ($SO_3$) in a supercritical state, wherein the composition is an organic material removal composition.

9. The composition of claim 8, wherein the first component is carbon dioxide.

10. The composition of claim 9, wherein a ratio of carbon dioxide:sulfur trioxide is about 10:1 by volume to about 1:1 by volume.

11. The composition of claim 8, wherein a ratio of the first component to the total of the second component plus sulfur trioxide is about 1:100 by volume to about 100:1 by volume.

12. The composition of claim 8, wherein the first component is in a supercritical state.

13. The composition of claim 8, wherein the second component is in a supercritical state.

14. The composition of claim 8, wherein the first component and the second component are both in supercritical states.

15. The composition of claim 8, further comprising a component selected from the group consisting of hydrogen chloride, hydrogen bromide, hydrogen fluoride, ammonium fluoride, tetramethylammonium fluoride, tetramethylammonium hydroxide, beta-diketones, fluorinated-diketones, organic acids, and combinations thereof.

16. The composition of claim 8 further comprising a substrate assembly in contact with the organic material removal composition.

17. A composition comprising sulfur trioxide ($SO_3$) in a supercritical state and an oxidizer, wherein the composition is a composition for removing exposed organic material from an object.

18. The composition of claim 17 further comprising a substrate assembly in contact with the composition for removing exposed organic material from an object.

19. A composition comprising:
   a first component selected from the group consisting of carbon dioxide ($CO_2$), ammonia ($NH_3$), $H_2O$, nitrous oxide ($N_2O$), carbon monoxide (CO), nitrogen ($N_2$), helium (He), neon (Ne), argon (Ar), krypton (Kr), and xenon (Xe);
   a second component selected from the group consisting of sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); and
   sulfur trioxide ($SO_3$) in a supercritical state, wherein the composition is a composition for removing exposed organic material from an object.

20. The composition of claim 19 further comprising a substrate assembly in contact with the composition for removing exposed organic material from an object.

21. A composition comprising sulfur trioxide ($SO_3$) in a supercritical state and an oxidizer, wherein the composition is a composition for removing exposed organic material from a substrate assembly.

22. A composition comprising:
   a first component selected from the group consisting of carbon dioxide ($CO_2$), ammonia ($NH_3$), $H_2O$, nitrous oxide ($N_2O$), carbon monoxide (CO), nitrogen ($N_2$), helium (He), neon (Ne), argon (Ar), krypton (Kr), and xenon (Xe);
   a second component selected from the group consisting of sulfur dioxide ($SO_2$), nitrous oxide ($N_2O$), NO, $NO_2$, ozone ($O_3$), hydrogen peroxide ($H_2O_2$), $F_2$, $Cl_2$, $Br_2$, and oxygen ($O_2$); and
   sulfur trioxide ($SO_3$) in a supercritical state, wherein the composition is a composition for removing exposed organic material from a substrate assembly.

* * * * *

UNITED STATES PATENT AND TRADEMARK OFFICE
CERTIFICATE OF CORRECTION

PATENT NO. : 6,770,426 B1
DATED : August 3, 2004
INVENTOR(S) : Vaartstra It is certified that error appears in the above-identified patent and that said Letters Patent is hereby corrected as shown below:

Column 7,
Line 17, please delete "it,".

Signed and Sealed this

Twenty-second Day of February, 2005

JON W. DUDAS
*Director of the United States Patent and Trademark Office*